United States Patent [19]

Shimada et al.

[11] Patent Number: 4,567,542

[45] Date of Patent: Jan. 28, 1986

[54] MULTILAYER CERAMIC SUBSTRATE WITH INTERLAYERED CAPACITOR

[75] Inventors: Yuzo Shimada; Kazuaki Utsumi; Teruyuki Ikeda; Masanori Suzuki, all of Tokyo, Japan

[73] Assignee: NEC Corporation, Tokyo, Japan

[21] Appl. No.: 603,109

[22] Filed: Apr. 23, 1984

[51] Int. Cl.[4] .................. H01G 4/10; H01L 19/00
[52] U.S. Cl. ..................... 361/321; 357/51; 501/136
[58] Field of Search ............. 361/320, 321; 501/136, 501/137; 252/519, 520, 521; 357/51

[56] References Cited

U.S. PATENT DOCUMENTS

| | | | |
|---|---|---|---|
| 3,264,709 | 8/1966 | Lupfer | 361/321 X |
| 3,340,074 | 9/1967 | Herczog | 361/321 X |
| 3,430,110 | 2/1969 | Goshgarian | 357/51 |
| 3,619,739 | 11/1971 | Camenzino et al. | 357/51 |
| 3,683,245 | 8/1972 | Bacher et al. | 361/321 X |
| 4,063,341 | 12/1977 | Bouchard et al. | 361/321 X |
| 4,082,906 | 4/1978 | Amin | 361/320 |
| 4,228,482 | 10/1980 | Bouchard et al. | 361/321 |
| 4,233,615 | 11/1980 | Takemoto et al. | 357/51 X |

Primary Examiner—Donald A. Griffin

Attorney, Agent, or Firm—Laff, Whitesel, Conte & Saret

[57] ABSTRACT

A multilayer ceramic substrate with an interlayered capacitor has a large electrostatic capacity and a high flexural strength, such as 1,500 Kg/cm$^2$ or more, and yet is manufactured at a relatively low firing or sintering temperature. A first ceramic body includes a plurality of laminated first ceramic sheets with a high dielectric constant and with a plurality of internal electrodes sandwiching the respective first ceramic sheets to form capacitors therebetween. A second ceramic body is laminated over one side of the first ceramic body and has a plurality of laminated second ceramic sheets with a low dielectric constant. A plurality of first wiring layers are sandwiched between the second ceramic sheets. A third ceramic body is laminated over the other side of the first ceramic body and has a plurality of laminated third ceramic sheets formed of the same ceramic material that is used to make the second ceramic sheets. The second and third ceramic bodies are thicker than the first ceramic body. A second embodiment of the invention is a hybrid ceramic structure made of glass-ceramic insulator layers sandwiching at least one dielectric layer with interposed circuit patterns formed thereon.

7 Claims, 11 Drawing Figures

MULTILAYER CERAMIC SUBSTRATE WITH INTERLAYERED CAPACITOR

BACKGROUND OF THE INVENTION

The present invention relates to a multilayer ceramic substrate having an interlayered capacitor.

A plurality of semiconductor chips are mounted directly on a multilayer ceramic substrate. Each semiconductor chip may be an IC or an LSI. A capacitor can be formed within the substrate by sandwiching an inner ceramic sheet between a pair of conductor layers. In such an integrated capacitor substrate, conductor pads are formed on the top sheet and wirings are formed within the substrate to connect the capacitor and the pads.

The capacitor substrate is manufactured by a green sheet laminating technique. According to this technique, green sheets are successively laminated and then are sintered or fired. The wirings are printed on each green sheet before the successive laminations. In a conventional green sheet laminating technique, alumina is used as the green sheet. The laminated green sheets must, therefore, be sintered at a sintering or firing temperature of 1,500° C. or higher. In view of the high sintering temperature, the wirings must be made of molybdenum, tungsten, or a like conductor material having a high melting point.

For such a high melting point conductor material, sintering must be carried out in a reducing atmosphere as, for example, in a hydrogen furnace. Due to the necessity of a high sintering temperature and a reduced atmosphere, the installation for manufacture is large scale, expensive, and objectionable from the viewpoint of energy saving.

The high melting point conductor material has a poor electrical conductivity. Each conductor for the wirings must, therefore, be relatively thick. This results in larger dimensions for the wirings.

Moreover, since all ceramic sheets are made of alumina, the dielectric constant is very low, say, nine or so, and a capacity of only about 3 pF/mm$^2$ can be obtained.

On the other hand, when a material having a high dielectric constant, such as steatite, forsterite, berium titanate, titanium dioxide, etc., can be used for the ceramic sheet instead of alumina, the mechanical strength of the substrate is low. Although, it can be utilized satisfactorily as a chip component, it is not acceptable for use as a circuit substrate.

It is mandatory, in general, for a multilayer substrate to have sufficient mechanical strength to support semiconductor chips and supporting structures mounted thereon. It is preferable that a multilayer substrate should have a flexural strength which is not less than 1,500 Kg/cm$^2$.

SUMMARY OF THE INVENTION

It is, therefore, a principal object of the present invention to provide a multilayer ceramic substrate which can give a large electrostatic capacity.

It is another principal object of this invention to provide a multilayer ceramic substrate of the type described, which has a high flexural strength, such as 1,500 Kg/cm$^2$, or more.

It is still another principal object of this invention to provide a multilayer ceramic substrate of the type described, which can be manufactured at a relatively low firing or sintering temperature.

It is a subordinate object of this invention to provide a multilayer glass-ceramic substrate of the type described, in which even nickel, chromium, or a like conductor material, can be used in fabricating wirings or circuit patterns.

It is another subordinate object of this invention to provide a multilayer glass-ceramic substrate of the type described, which can be manufactured even in an oxidizing atmosphere.

Other objects of this invention will become clear as the description proceeds.

According to this invention, a multilayer ceramic substrate has an interlayered capacitor. A first ceramic body has a pair of principal surfaces and includes a plurality of laminated first ceramic sheets with a high dielectric constant and with a plurality of internal electrodes sandwiching the respective first ceramic sheets to form capacitors therebetween. A second ceramic body is laminated over one of the principal surfaces of the first ceramic body and has a plurality of laminated second ceramic sheets with a low dielectric constant. A plurality of first wiring layers are sandwiched between the second ceramic sheets. A third ceramic body is laminated over the other of the principal surfaces of the first ceramic body and has a plurality of laminated third ceramic sheets formed of the same ceramic material that is used to make the second ceramic sheets. The thicknesses of the second ceramic body and of the third ceramic body are larger than the thickness of the first ceramic body. A plurality of external electrodes are provided on an external surface of the second ceramic body.

According to another aspect of this invention, a hybrid ceramic structure comprises a plurality of glass-ceramic insulator layers sandwiching at least one dielectric layer with interposed circuit patterns formed thereon. Each glass-ceramic insulator layer has a composition consisting essentially of oxides, as follows: 40 through 60 percent by weight of lead oxide, 1 through 30 percent by weight of boron oxide, 2 through 40 percent by weight of silicon dioxide, zero through 2.5 percent by weight of at least one oxide selected from oxides of chemical elements of Group I of the periodic table, 0.01 through 25 percent by weight of at least one oxide selected from oxides of chemical elements of Group II of the periodic table, and 0.01 through 10 percent by weight of at least one oxide selected from oxides of chemical elements of Group IV of the periodic table, except for carbon, silicon, and lead.

Preferably, the oxides of the Group I chemical elements are sodium and potassium. The oxides of the Group II chemical elements are magnesium oxide, calcium oxide, strontium oxide, barium oxide, and zinc oxide. The oxides of the Group IV chemical elements are zirconium dioxide, titanium dioxide, germanium dioxide, and stannic oxide. Briefly speaking, the multilayer substrate includes a pair of insulator layers of alumina ceramic containing boroxilicate-lead-glass and at least one high dielectric ceramic layer for making capacitors sandwiched between the insulator layers.

BRIEF DESCRIPTION OF THE DRAWINGS

FIG. 1(a) to FIG. 9(a) are plan views, at each process step, during the manufacture of a multilayer ceramic substrate sheets according to one embodiment of this invention;

FIG. 1(b) to FIG. 9(b) are sectional views of the same sheets, at each process step during the manufacture, corresponding to the steps shown in FIG. 1(a) to FIG. 9(a);

DESCRIPTION OF THE PREFERRED EMBODIMENTS

A multilayer ceramic substrate, according to a preferred embodiment of the present invention, is manufactured according to a conventional green sheet laminating technique. For this purpose, a composition is used which will later be described in detail. The composition is dispersed in a solvent together with an organic binder, to form a slurry. Each green sheet is formed with a uniform thickness from the slurry, by using the known doctor blading technique.

The green insulator sheet is punched to the desired size and utilized as green insulator sheets 20, as shown in FIGS. 1(a) and 1(b). A green resistor sheet 21 is then prepared, as shown in FIGS. 2(a) and 2(b).

Figure 3:
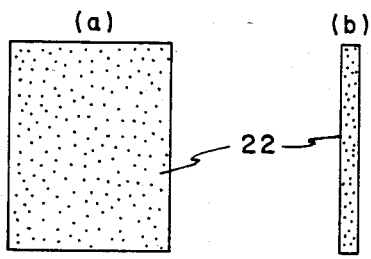
Figure 4:
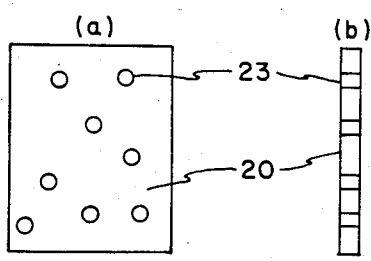
Figure 5:
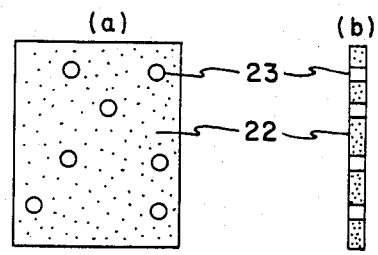
Figure 6:
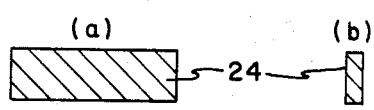

Similarly, the green dielectric sheet formed as described above is punched to the desired size as shown in FIGS. 3(a) and 3(b) to obtain green dielectric sheets 22. Next, vertically-conducting through holes 23 are formed in the green insulator sheets 20 by means of either a punching or drilling process, as shown in FIGS. 4(a) and 4(b). The through holes 23 formed here can be reduced to a minimum of 100 μm in diameter. The through holes 23 provide for the conduction of the internal electrodes for the capacitors and are formed likewise in the green dielectric sheets 21 as shown in FIGS. 5(a) and 5(b). The green resistor sheet 21 is punched and cut to the desired size, as shown in FIGS. 6(a) and 6(b), to form green resistor sheet pieces 24 to ensure the desired resistance values.

Next, as shown in FIGS. 7(a) and 7(b), conductor layers 25 forming the signal wires and shield wires are applied by screen printing on the green insulator sheets provided with through holes 23. Conductors are embedded in the through holes. A paste consisting of an alloy including one or more metals such as gold, silver, palladium, and platinum is used for the conductors.

Similarly, conductors are formed in the through holes and their neighborhood, on the green insulator sheets.

Conductive layers are formed, to act as internal electrodes for the capacitors. These layers are formed on the green dielectric sheets 22 having the through holes 23, as shown in FIGS. 8(a) and 8(b). The conductor added in FIGS. 7(a) and 7(b) was formed by screen printing and was embedded in the through holes to provide connections to two electrodes, for each vertically disposed capacitor. The resistor sheet pieces 24 are punched and cut to the given size and are bonded or pasted by a hot press onto the green insulator sheets 20, as shown in FIGS. 9(a) and 9(b), to obtain unified sheets.

Figure 1:
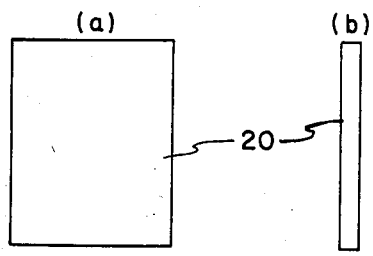
Figure 2:
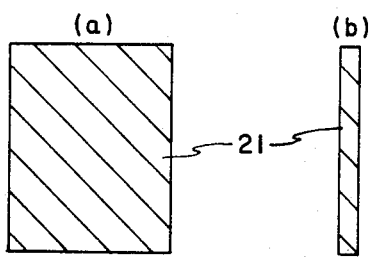
Figure 7:
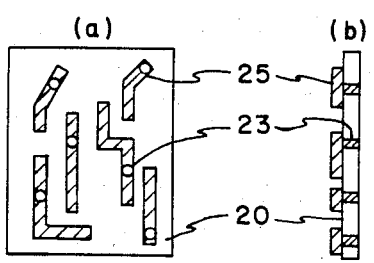
Figure 8:
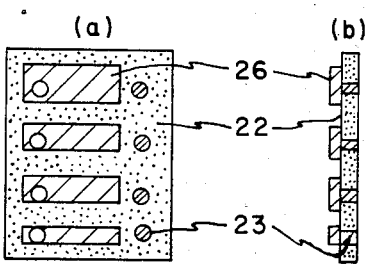
Figure 9:
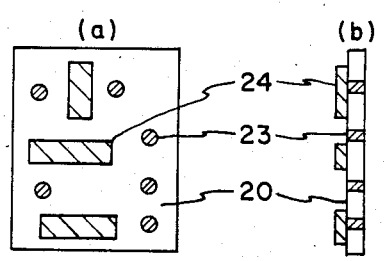
Figure 10:
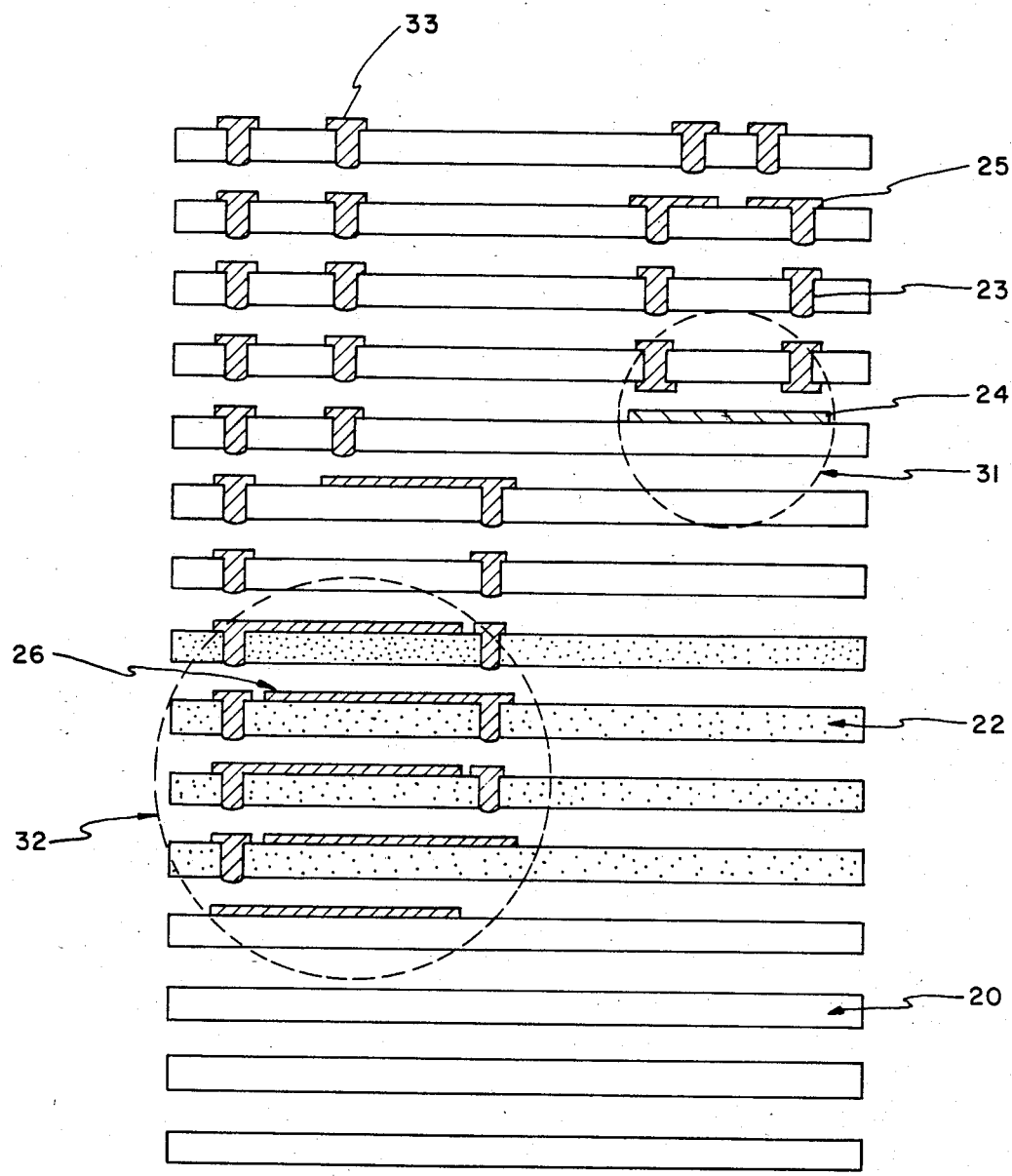
FIG. 10 is a sectional view of the laminate obtained at each process step during the manufacture, corresponding to FIG. 1 to FIG. 9.

Next, as shown in FIG. 10, the sheets of FIGS. 7, 8 and 9, the green insulator sheets 20 of FIG. 1 are used to adjust the thickness of each sheet of the laminate. The green insulator sheets, in which conductors are formed in the through holes and their neighborhood, are built together at temperatures of 200° to 130° C. and pressures of 200 to 300 Kg/cm$^2$. In FIG. 10, the structure is such that green insulator sheets 20 sandwich green dielectric sheets 22 which are piled up vertically. The green dielectric sheet portion and the conductor layers 26 are arranged vertically to become a capacitor formation portion 32 (indicated by a broken line in FIG. 10) after sintering. The capacitor is connected to conductor layers 33 for external terminals via the through holes 23 and the conductor layers. A green RuO$_2$ resistor sheet 24 forms a resistor portion 31 (also indicated by a broken line) by the lamination and sintering, which is lead outwardly by the through holes 23 and the conductor wires. The laminate thus obtained is cut to the desired size and sintered.

The sintering profile consists of three process steps: a binder removal step, a calcining step, and a sintering step. In the binder removal step, the laminate is held at a maximum of 400° C. for three hours; and in the calcination and sintering steps, a continuous furnace is used at 800° C. and 900° C., respectively.

This invention is effective enough to enable the fabrication of a multilayer ceramic hybrid substrate including resistors, capacitors, signal wires, shield layers, and other components by forming the resistors, dielectrics, insulators, and conductors and then sintering them simultaneously at a temperature in the range of 800° C. to 1000° C.

In view of flexural strength, it is preferable that the total thickness of laminated high dielectric ceramic sheets is smaller than that of laminated low dielectric ceramic sheets.

Preferred examples of the compositions and the multilayer ceramic substrates will now be described.

Powder of aluminum oxide and powder of borosilicate-lead series glass were weighed to provide various compositions listed below. The components are expressed as oxides, in percent by weight, and in Tables 1 and 2 as samples Nos. 1 through 54. In Table 1, the oxides of chemical elements of Groups I, II and IV of the periodic table are given, in totals, respectively, for each sample. The oxides of the Groups I, II and IV chemical elements are shown in detail in Table 2 for the respective samples, as numbered in Table 1. The percentages of components of each composition given in Tables 1 and 2 are within the limits of the composition specified hereinabove.

TABLE 1

| Sample | Al$_2$O$_3$ | PbO | B$_2$O$_3$ | SiO$_2$ | Oxide(s) of Group II element(s) | Oxide(s) of Group IV element(s) | Oxide(s) of Group I element(s) |
|---|---|---|---|---|---|---|---|
| 1 | 60 | 1.0 | 10.3 | 22.7 | 4.0 | 1.0 | 1.0 |
| 2 | 60 | 23.1 | 1.0 | 8.59 | 5.9 | 0.91 | 0.5 |
| 3 | 60 | 23.24 | 8.3 | 2.0 | 2.55 | 1.91 | 2.0 |
| 4 | 60 | 12.8 | 6.7 | 6.3 | 9.3 | 3.0 | 1.9 |
| 5 | 55 | 20.2 | 3.9 | 3.0 | 11.1 | 4.7 | 2.1 |
| 6 | 50 | 8.3 | 3.4 | 32.5 | 3.0 | 0.55 | — |
| 7 | 50 | 10.0 | 5.0 | 28.3 | 6.1 | 0.6 | — |
| 8 | 50 | 12.0 | 4.5 | 26.99 | 0.01 | 5.5 | 1.0 |
| 9 | 50 | 9.5 | 8.3 | 7.3 | 20.0 | 2.9 | 2.0 |
| 10 | 50 | 22.0 | 15.4 | 6.49 | 4.0 | 0.01 | 2.1 |
| 11 | 50 | 10.7 | 8.3 | 4.7 | 15.0 | 10.0 | 1.3 |
| 12 | 50 | 20.1 | 3.8 | 16.4 | 2.7 | 5.0 | 2.0 |
| 13 | 50 | 32.1 | 3.5 | 7.2 | 6.2 | 1.0 | — |
| 14 | 50 | 11.3 | 25.1 | 6.4 | 2.4 | 3.2 | 1.6 |
| 15 | 50 | 2.8 | 1.1 | 37.1 | 5.5 | 1.5 | 2.0 |
| 16 | 50 | 8.4 | 5.6 | 2.1 | 23.0 | 7.0 | 2.0 |
| 17 | 45 | 18.4 | 10.2 | 3.9 | 15.1 | 7.4 | — |
| 18 | 40 | 14.5 | 13.6 | 2.5 | 23.0 | 4.6 | 1.8 |
| 19 | 40 | 11.0 | 16.4 | 12.8 | 12.7 | 7.1 | — |
| 20 | 40 | 39.0 | 4.0 | 4.5 | 10.0 | 1.5 | 1.0 |

TABLE 1-continued

| Sample | Al₂O₃ | PbO | B₂O₃ | SiO₂ | Oxide(s) of Group II element(s) | Oxide(s) of Group IV element(s) | Oxide(s) of Group I element(s) |
|---|---|---|---|---|---|---|---|
| 21 | 40 | 10.7 | 28.0 | 7.0 | 10.2 | 2.1 | 2.0 |
| 22 | 40 | 6.0 | 1.2 | 38.2 | 10.5 | 2.3 | 1.8 |
| 23 | 55 | 7.4 | 3.1 | 29.2 | 2.6 | 0.5 | 2.2 |
| 24 | 55 | 7.5 | 3.1 | 26.2 | 3.19 | 2.51 | 2.5 |
| 25 | 40 | 16.6 | 1.0 | 37.1 | 2.7 | 0.6 | 2.0 |
| 26 | 60 | 4.1 | 9.0 | 13.0 | 7.7 | 3.9 | 2.3 |
| 27 | 45 | 8.5 | 3.1 | 27.1 | 10.15 | 4.15 | 2.0 |
| 28 | 50 | 10.0 | 7.8 | 19.5 | 8.0 | 2.5 | 2.2 |
| 29 | 40 | 13.0 | 6.0 | 25.8 | 10.19 | 3.01 | 2.0 |
| 30 | 50 | 5.0 | 2.2 | 30.5 | 2.79 | 2.51 | 2.0 |
| 31 | 50 | 8.2 | 3.4 | 30.6 | 1.0 | 4.9 | 1.8 |
| 32 | 50 | 8.2 | 3.4 | 30.9 | 1.5 | 4.4 | 1.5 |
| 33 | 50 | 8.2 | 3.4 | 30.2 | 2.0 | 3.9 | 2.2 |
| 34 | 50 | 8.2 | 3.4 | 30.2 | 3.0 | 2.9 | 2.2 |
| 35 | 50 | 8.2 | 3.4 | 30.2 | 3.0 | 2.9 | 2.2 |
| 36 | 50 | 8.2 | 3.4 | 30.2 | 3.0 | 2.9 | 2.2 |
| 37 | 50 | 8.2 | 3.4 | 30.2 | 3.0 | 2.9 | 2.2 |
| 38 | 50 | 8.2 | 3.4 | 30.2 | 3.0 | 2.9 | 2.2 |
| 39 | 50 | 8.2 | 3.4 | 32.4 | 3.0 | 2.9 | — |
| 40 | 50 | 8.2 | 3.4 | 32.4 | 3.0 | 2.9 | — |
| 41 | 50 | 8.2 | 3.4 | 32.4 | 3.0 | 2.9 | — |
| 42 | 50 | 8.2 | 3.4 | 30.2 | 3.0 | 2.9 | 2.2 |
| 43 | 50 | 8.2 | 3.4 | 32.4 | 3.0 | 2.9 | — |
| 44 | 50 | 8.2 | 3.4 | 32.4 | 3.0 | 2.9 | — |
| 45 | 50 | 8.3 | 3.4 | 30.2 | 3.0 | 2.9 | 2.2 |
| 46 | 50 | 8.3 | 3.4 | 30.2 | 3.0 | 2.9 | 2.2 |
| 47 | 50 | 8.3 | 3.4 | 32.4 | 3.0 | 2.9 | — |
| 48 | 50 | 8.3 | 3.4 | 32.4 | 3.0 | 2.9 | — |
| 49 | 50 | 8.3 | 3.4 | 32.4 | 3.0 | 2.9 | — |
| 50 | 50 | 8.3 | 3.4 | 32.4 | 3.0 | 2.9 | — |
| 51 | 50 | 8.3 | 3.4 | 32.4 | 3.0 | 2.9 | — |
| 52 | 50 | 8.3 | 3.4 | 32.4 | 3.0 | 2.9 | — |
| 53 | 50 | 8.3 | 3.4 | 32.4 | 3.0 | 2.9 | — |
| 54 | 50 | 8.3 | 3.4 | 30.2 | 3.0 | 2.9 | 2.2 |

TABLE 2

| | Oxide(s) of element(s) of Group II | | | | | Oxide(s) of element(s) of Group IV | | | | Oxide(s) of element(s) of Group I | |
|---|---|---|---|---|---|---|---|---|---|---|---|
| Sample | MgO | CaO | SrO | BaO | ZnO | ZrO | TiO₂ | GeO₂ | SnO₂ | Na₂O | K₂O |
| 1 | 1.1 | 2.4 | — | 0.4 | 0.1 | 0.4 | 0.6 | — | — | 0.5 | 0.5 |
| 2 | 0.3 | 4.0 | — | 0.7 | 1.0 | 0.8 | 0.01 | — | — | 0.5 | — |
| 3 | 0.7 | 0.05 | — | 0.5 | 1.3 | 0.01 | 1.9 | — | — | 1.0 | 1.0 |
| 4 | 1.1 | 4.2 | — | — | 4.0 | 1.1 | 1.9 | — | — | 1.0 | 0.9 |
| 5 | 3.2 | 3.9 | — | 1.6 | 2.4 | 1.5 | 3.2 | — | — | 1.1 | 1.0 |
| 6 | 0.2 | 2.7 | — | 0.1 | — | 0.45 | 0.1 | — | — | — | — |
| 7 | 0.5 | 5.5 | — | 0.1 | — | 0.5 | 0.1 | — | — | — | — |
| 8 | — | 0.01 | — | — | — | 3.0 | 2.5 | — | — | 1.0 | — |
| 9 | 5.0 | 5.0 | 2.3 | 4.5 | 3.2 | 1.1 | 1.8 | — | — | 1.5 | 0.5 |
| 10 | 0.3 | 0.2 | 1.1 | 0.1 | 0.5 | 0.01 | — | — | — | 1.1 | 1.0 |
| 11 | 4.2 | 8.0 | 1.9 | 0.6 | 0.3 | 5.0 | 5.0 | — | — | 0.7 | 0.6 |
| 12 | — | — | 1.5 | 1.2 | — | 2.0 | 3.0 | — | — | 1.0 | 1.0 |
| 13 | — | — | 3.0 | — | 3.2 | — | 1.0 | — | — | — | — |
| 14 | — | 2.4 | — | — | — | — | 3.2 | — | — | 0.8 | 0.8 |
| 15 | — | — | 4.0 | 1.5 | — | 1.5 | — | — | — | 1.0 | 1.0 |
| 16 | 5.8 | 10.0 | — | 7.2 | — | 4.0 | 3.0 | — | — | 1.0 | 1.0 |
| 17 | 10.0 | 1.5 | — | 1.9 | 1.7 | 3.3 | 4.1 | — | — | — | — |
| 18 | 3.7 | 6.3 | — | 10.0 | 3.0 | 2.1 | 2.5 | — | — | 0.9 | 0.9 |
| 19 | 3.2 | 7.1 | — | 0.6 | 1.8 | 2.1 | 5.0 | — | — | — | — |
| 20 | — | 5.0 | — | 3.0 | 2.0 | 0.5 | 1.0 | — | — | 1.0 | — |
| 21 | 1.6 | 3.0 | — | 5.0 | 0.6 | 0.7 | 1.4 | — | — | 1.0 | 1.0 |
| 22 | 2.3 | 2.2 | — | 1.0 | 5.0 | 0.8 | 1.5 | — | — | 0.9 | 0.9 |
| 23 | 0.2 | 2.3 | — | 0.1 | — | 0.4 | 0.1 | — | — | 1.1 | 1.1 |
| 24 | 2.0 | 2.4 | — | 0.09 | — | 2.3 | 0.01 | — | — | 1.3 | 1.2 |
| 25 | 0.2 | 2.4 | — | 0.1 | — | 0.3 | 0.3 | — | — | 1.0 | 1.0 |
| 26 | 2.2 | 5.0 | — | 0.5 | — | 2.5 | 1.4 | — | — | 1.2 | 1.1 |
| 27 | 0.1 | 10.0 | — | 0.05 | — | 2.15 | 2.0 | — | — | 1.0 | 1.0 |
| 28 | 4.3 | 1.2 | — | 2.5 | — | 1.5 | 1.0 | — | — | 1.1 | 1.1 |
| 29 | 2.1 | 8.0 | — | 1.09 | — | 2.0 | 0.01 | — | — | 1.0 | 1.0 |
| 30 | 1.1 | 6.5 | — | 0.19 | — | 0.01 | 2.5 | — | — | 1.0 | 1.0 |
| 31 | 1.0 | — | — | — | — | 2.9 | 2.0 | — | — | 0.9 | 0.9 |
| 32 | — | — | 1.5 | — | — | — | 2.4 | 1.0 | 1.0 | 1.0 | 0.5 |
| 33 | — | — | — | 2.0 | — | 1.0 | 1.0 | — | 1.9 | 1.1 | 1.1 |
| 34 | — | — | — | — | 3.0 | — | 1.0 | 1.0 | 0.9 | 1.1 | 1.1 |
| 35 | 1.0 | 2.0 | — | — | — | — | — | 2.9 | — | 1.1 | 1.1 |
| 36 | 1.6 | — | 1.4 | — | — | — | — | — | 2.9 | 1.1 | 1.1 |
| 37 | 1.7 | — | — | 1.3 | — | — | — | 1.4 | 1.5 | 1.1 | 1.1 |
| 38 | 0.9 | — | — | — | 2.1 | 1.8 | — | — | 1.1 | 1.1 | 1.1 |
| 39 | — | 2.3 | 0.7 | — | — | — | 1.9 | — | 1.0 | — | — |
| 40 | — | 2.9 | — | 0.1 | — | — | 1.5 | 1.4 | — | — | — |
| 41 | — | 2.2 | — | — | 0.8 | 0.7 | — | 1.3 | 0.9 | — | — |
| 42 | — | — | 1.6 | — | 1.4 | — | 1.0 | 0.6 | 1.3 | 1.1 | 1.1 |
| 43 | — | — | — | 1.8 | 1.2 | 0.7 | 0.7 | — | 1.5 | — | — |
| 44 | 1.0 | 0.7 | 0.3 | — | — | 1.3 | 1.2 | 0.4 | — | — | — |
| 45 | 1.1 | — | 0.9 | 1.0 | — | 0.6 | 1.1 | 0.3 | 0.9 | 1.1 | 1.1 |
| 46 | 1.3 | — | 1.2 | — | 0.5 | 0.6 | 1.3 | 0.5 | 0.5 | 1.1 | 1.1 |
| 47 | 0.8 | — | — | 0.5 | 1.7 | 0.6 | 0.1 | 1.3 | 0.9 | — | — |
| 48 | — | 1.4 | 0.7 | 0.9 | — | 0.6 | 0.7 | 1.3 | 0.4 | — | — |
| 49 | — | 0.8 | 1.1 | — | 1.1 | 1.5 | 0.2 | 0.6 | 0.6 | — | — |
| 50 | — | — | 0.4 | 0.9 | 1.7 | 0.4 | 1.6 | 0.5 | 0.4 | — | — |
| 51 | — | 0.7 | 0.9 | 0.9 | 0.5 | 0.7 | 0.2 | 0.9 | 1.1 | — | — |
| 52 | 0.5 | — | 1.1 | 0.6 | 0.8 | 1.3 | 0.3 | 1.1 | 0.2 | — | — |

TABLE 2-continued

| Sample | Oxide(s) of element(s) of Group II | | | | | Oxide(s) of element(s) of Group IV | | | | Oxide(s) of element(s) of Group I | |
|---|---|---|---|---|---|---|---|---|---|---|---|
| | MgO | CaO | SrO | BaO | ZnO | ZrO | TiO$_2$ | GeO$_2$ | SnO$_2$ | Na$_2$O | K$_2$O |
| 53 | 0.8 | 0.3 | 0.9 | — | 1.0 | 0.4 | 0.1 | 1.1 | 1.3 | — | — |
| 54 | 0.6 | 0.7 | 1.3 | 0.4 | — | 0.1 | 1.9 | 0.6 | 0.3 | 1.1 | 1.1 |

The weighed powders were blended or mixed in a ball mill, while wet, to provide a mixture. This blending continued during, for example, twenty-four hours. Together with an organic binder, the mixture was suspended in a solvent to form a slurry. The binder may be polyvinyl, butylal, polyvinyl alcohol, or an acrylic resin. The solvent may be ethylene glycol monoethyl ether.

Green sheets of a uniform thickness between 10 microns and 190 microns were formed from the slurry by a use of the known doctor blading technique. The green sheets of various uniform thicknesses were cut or blanked into rectangular sheets having a common area of 60 mm × 40 mm. In compliance with the wirings to be formed for the semiconductor chips, through or via holes were formed through the rectangular sheets, by a punch and die. Conductor or metallic paste was applied onto the punched sheets by the known screen printing process. The conductor paste included gold, silver, platinum, palladium, copper, nickel, chromium, a gold palladium alloy, a silver gold alloy, a silver palladium alloy, or the like.

As for the green dielectric sheet, various ceramic compositions are listed in Table 3 as sample Nos. 101 through 122, and are expressed in percent by mole.

In Table 4, various resistor compositions are listed as samples Nos. 201 through 230, and are expressed in percent by weight.

TABLE 3

| Sample | Dielectric (mol %) | Sintering Temperature | Dielectric Constant |
|---|---|---|---|
| 101 | Pb(Fe$^{\frac{2}{3}}$W$^{\frac{1}{3}}$)O$_3$ 100 | 880° C. | 6000 |
| 102 | Pb(Fe$^{\frac{2}{3}}$W$^{\frac{1}{3}}$)O$_3$ 50 - Pb(Fe$^{\frac{1}{2}}$Nb$^{\frac{1}{2}}$)O$_3$ 50 | 910° C. | 10000 |
| 103 | Pb(Fe$^{\frac{2}{3}}$W$^{\frac{1}{3}}$)O$_3$ 33 - Pb(Fe$^{\frac{1}{2}}$Nb$^{\frac{1}{2}}$)O$_3$ 67 | 950° C. | 18000 |
| 104 | Pb(Fe$^{\frac{2}{3}}$W$^{\frac{1}{3}}$)O$_3$ 20 - Pb(Fe$^{\frac{1}{2}}$Nb$^{\frac{1}{2}}$)O$_3$ 80 | 990 | 19000 |
| 105 | Pb(Fe$^{\frac{1}{2}}$Nb$^{\frac{1}{2}}$)O$_3$ 100 | 1050 | 20000 |
| 106 | Pb(Mg$^{\frac{1}{2}}$W$^{\frac{1}{2}}$)O$_3$ 100 | 860 | 200 |
| 107 | Pb(Mg$^{\frac{1}{2}}$W$^{\frac{1}{2}}$)O$_3$ 66 - PbTiO$_3$ 34 | 900 | 4000 |
| 108 | Pb(Mg$^{\frac{1}{2}}$W$^{\frac{1}{2}}$)O$_3$ 60 - PbTiO$_3$ 40 | 1000 | 7000 |
| 109 | Pb(Mg$^{\frac{1}{2}}$W$^{\frac{1}{2}}$)O$_3$ 50 - PbTiO$_3$ 50 | 1050 | 10000 |
| 110 | Pb(Mg$^{\frac{1}{2}}$W$^{\frac{1}{2}}$)O$_3$ 99 - Pb(Mn$^{\frac{1}{2}}$*Me$^{\frac{2}{3}}$)O$_3$ 1 | 860 | 200 |
| 111 | Pb(Mg$^{\frac{1}{2}}$W$^{\frac{1}{2}}$)O$_3$ 65 - PbTiO$_3$ 34 - Pb(Mn$^{\frac{1}{2}}$*Me$^{\frac{2}{3}}$)O$_3$ 1 | 900 | 3800 |
| 112 | Pb(Mg$^{\frac{1}{2}}$W$^{\frac{1}{2}}$)O$_3$ 58 - PbTiO$_3$ 40 - Pb(Mn$^{\frac{1}{2}}$*Me$^{\frac{2}{3}}$)O$_3$ 2 | 950 | 5000 |
| 113 | Pb(Mg$^{\frac{1}{2}}$W$^{\frac{1}{2}}$)O$_3$ 50 - PbTiO$_3$ 49 - Pb(Mn$^{\frac{1}{2}}$*Me$^{\frac{2}{3}}$)O$_3$ 1 | 1050 | 10000 |
| 114 | Pb(Fe$^{\frac{2}{3}}$W$^{\frac{1}{3}}$)O$_3$ 36 - Pb(Fe$^{\frac{1}{2}}$Nb$^{\frac{1}{2}}$)O$_3$ 62 - Pb(Zn$^{\frac{1}{3}}$Nb$^{\frac{2}{3}}$)O$_3$ 2 | 950 | 18000 |
| 115 | Pb(Fe$^{\frac{2}{3}}$W$^{\frac{1}{3}}$)O$_3$ 36 - Pb(Fe$^{\frac{1}{2}}$Nb$^{\frac{1}{2}}$)O$_3$ 48 - Pb(Zn$^{\frac{1}{3}}$Nb$^{\frac{2}{3}}$)O$_3$ 16 | 890 | 14000 |
| 116 | Pb(Fe$^{\frac{2}{3}}$W$^{\frac{1}{3}}$)O$_3$ 36 - Pb(Fe$^{\frac{1}{2}}$Nb$^{\frac{1}{2}}$)O$_3$ 32 - Pb(Zn$^{\frac{1}{3}}$Nb$^{\frac{2}{3}}$)O$_3$ 32 | 900 | 7000 |
| 117 | Pb(Zn$^{\frac{1}{3}}$Nb$^{\frac{2}{3}}$)O$_3$ 30 - Pb(Fe$^{\frac{2}{3}}$W$^{\frac{1}{3}}$)O$_3$ 70 | 880 | 3400 |
| 118 | Pb(Mg$^{\frac{1}{2}}$W$^{\frac{1}{2}}$)O$_3$ 24 - PbTiO$_3$ 36 - Pb(Ni$^{\frac{1}{3}}$Nb$^{\frac{2}{3}}$)O$_3$ 40 | 990 | 6000 |
| 119 | Pb(Mg$^{\frac{1}{2}}$W$^{\frac{1}{2}}$)O$_3$ 63 - PbTiO$_3$ 33 - Pb(Mg$^{\frac{1}{3}}$Nb$^{\frac{2}{3}}$)O$_3$ 4 | 950 | 3500 |
| 120 | Pb(Fe$^{\frac{2}{3}}$W$^{\frac{1}{3}}$)O$_3$ 75 - PbTiO$_3$ 25 | 950 | 10200 |
| 121 | Pb(Fe$^{\frac{2}{3}}$W$^{\frac{1}{3}}$)O$_3$ 85 - PbTiO$_3$ 12 - Pb(Mn$^{\frac{1}{2}}$*Me$^{\frac{2}{3}}$)O$_3$ 3 | 920 | 2680 |
| 122 | Pb(Mg$^{\frac{1}{2}}$W$^{\frac{1}{2}}$)O$_3$ 54 - PbTiO$_3$ 23 - PbZrO$_3$ 23 | 1000 | 1800 |

*Me: Nb, Ta, Sb

TABLE 4

| Sample | Resistor (wt %) | Sheet resistance (Ω/□) |
|---|---|---|
| 201 | RuO$_2$ 5 - frit 95 | ∞ |
| 202 | RuO$_2$ 20 - frit 80 | 3 × 10$^3$ |
| 203 | RuO$_2$ 90 - frit 10 | 2 |
| 204 | Bi$_2$Ru$_2$O$_7$ 30 - frit 70 | ∞ |
| 205 | Bi$_2$Ru$_2$O$_7$ 65 - frit 45 | 10$^6$ |
| 206 | Bi$_2$Ru$_2$O$_7$ 95 - frit 5 | 30 |
| 207 | Gd$_2$Ru$_2$O$_7$ 20 - frit 80 | ∞ |
| 208 | Gd$_2$Ru$_2$O$_7$ 45 - frit 55 | 3 × 10$^5$ |
| 209 | Gd$_2$Ru$_2$O$_7$ 95 - frit 5 | 10$^4$ |
| 210 | Pb$_2$Ru$_2$O$_6$ 10 - frit 90 | ∞ |
| 211 | Pb$_2$Ru$_2$O$_6$ 40 - frit 60 | 2 × 10$^3$ |
| 212 | Pb$_2$Ru$_2$O$_6$ 95 - frit 5 | 2 × 10$^2$ |
| 213 | RuO$_2$ 35 - Bi$_2$Ru$_2$O$_7$ 35 - frit 30 | 8 |
| 214 | RuO$_2$ 25 - Bi$_2$Ru$_2$O$_7$ 25 - frit 50 | 10$^3$ |
| 215 | RuO$_2$ 10 - Bi$_2$Ru$_2$O$_7$ 30 - frit 60 | 10$^6$ |
| 216 | RuO$_2$ 35 - Gd$_2$Ru$_2$O$_7$ 35 - frit 30 | 2 × 10$^2$ |
| 217 | RuO$_2$ 20 - Gd$_2$Ru$_2$O$_7$ 20 - frit 60 | 3 × 10$^4$ |
| 218 | RuO$_2$ 10 - Gd$_2$Ru$_2$O$_7$ 20 - frit 70 | 10$^5$ |
| 219 | RuO$_2$ 45 - Gd$_2$Ru$_2$O$_7$ 45 - frit 10 | 70 |
| 220 | Bi$_2$Ru$_2$O$_7$ 35 - Gd$_2$Ru$_2$O$_7$ 35 - frit 30 | 10$^3$ |
| 221 | Bi$_2$Ru$_2$O$_7$ 30 - Gd$_2$Ru$_2$O$_7$ 15 - frit 55 | 10$^7$ |
| 222 | Bi$_2$Ru$_2$O$_7$ 50 - Gd$_2$Ru$_2$O$_7$ 45 - frit 5 | 3 × 10$^2$ |
| 223 | RuO$_2$ 35 - Pb$_2$Ru$_2$O$_6$ 35 - frit 30 | 50 |
| 224 | RuO$_2$ 10 - Pb$_2$Ru$_2$O$_6$ 20 - frit 70 | 2 × 10$^4$ |
| 225 | RuO$_2$ 40 - Pb$_2$Ru$_2$O$_6$ 50 - frit 10 | 20 |
| 226 | RuO$_2$ 63 - Bi$_2$Ru$_2$O$_7$ 3.5 - Gd$_2$Ru$_2$O$_7$ 3.5 - frit 30 | 7 |
| 227 | RuO$_2$ 35 - Bi$_2$Ru$_2$O$_7$ 21 - Gd$_2$Ru$_2$O$_7$ 14 - frit 30 | 70 |
| 228 | RuO$_2$ 7 - Bi$_2$Ru$_2$O$_7$ 14 - Gd$_2$Ru$_2$O$_7$ 49 - frit 30 | 2 × 10$^3$ |
| 229 | RuO$_2$ 10 - Bi$_2$Ru$_2$O$_7$ 20 - Gd$_2$Ru$_2$O$_7$ 10 - frit 60 | 10$^6$ |
| 230 | RuO$_2$ 10 - Pb$_2$Ru$_2$O$_6$ 15 - Bi$_2$Ru$_2$O$_7$ 10 - frit 65 | 2 × 10$^6$ |

The numbers of laminated green sheets are listed below in Table 5 for the respective samples, as numbered in Tables 1 and 2. After being hot compressed, the laminates were shaped as desired by a cutter. Each shaped laminate was sintered in air for one hour at a sintering or firing temperature between 700° C. and 1,400° C. as listed in Table 5 in °C. Before attaining the sintering temperature, the binder was completely removed or burnt out by maintaining each shaped laminate at about 500° C. in the non-reducing atmosphere for five hours.

In Table 5, the numbers of innerlayered components are also shown. Metals listed in Table 5 for the circuit patterns are only gold, silver, platinum, palladium, nickel, chromium, a gold palladium alloy, a gold platinum alloy, and a silver palladium alloy. Other alloys mentioned above have also been used.

Table 5, furthermore, lists capacities of innerlayered capacitor, and the flexural strength, in F and Kg/cm², respectively. Table 5 additionally shows the occurrence of peeling off in the multilayer substrate and dielectric constant of the dielectric layer after the sintering process.

Figure 11:
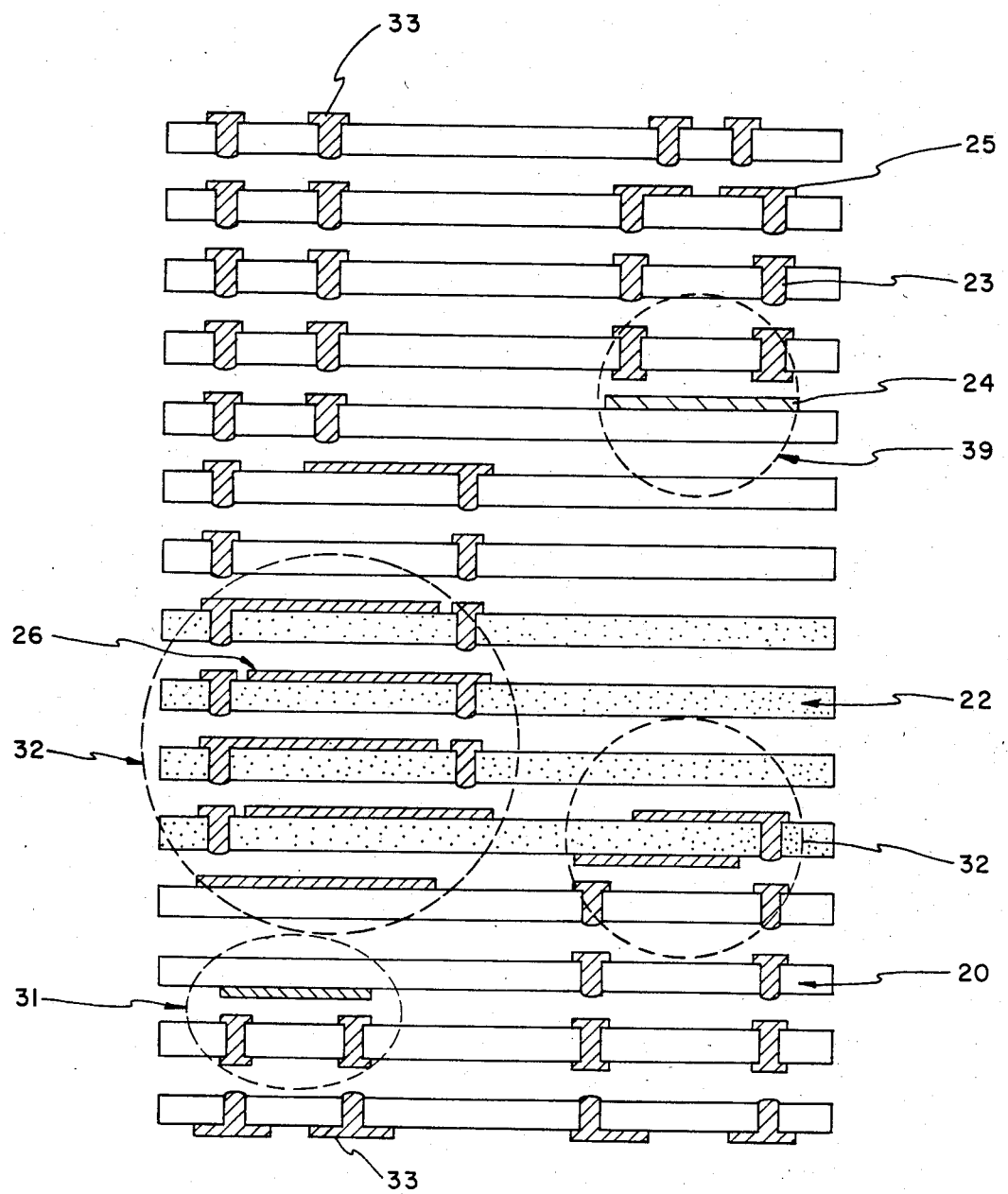
FIG. 11 is a sectional view of the laminate obtained by the second embodiment according to the present invention.

The present invention is not restricted to the structure shown in FIG. 10. For example, as shown in FIG. 11, external terminals are provided on both sides of the laminate. In this case, both the upper and lower surfaces of the laminate can be utilized effectively; therefore, the multilayer ceramic composite thus obtained has the advantage of a miniaturized structure with a higher density.

A capacitor is formed in the hybrid substrate containing capacitors, resistors, and conductors. In the example of this invention, the substrate has a capacity of about 1 nF/mm²; however, a capacitor of 10 μF maximum is formed, as an example. For a high dielectric material, a material which can be sintered at 850° C. to 950° C. or so can also be used, other than the composites listed on Table 3.

TABLE 5

| Sample | | | Sintering Temperature | Number of Green Sheets | | Number of Internal Elements | | Dielectric Constant | Capacity (F) | Metal | Flexural Strength (Kg/cm²) | Peeling Off |
|---|---|---|---|---|---|---|---|---|---|---|---|---|
| | | | | Insulator | Dielectric Layer | R | C | | | | | |
| 1 | 212 | 109 | 1400° C. | 20 | 4 | 10 | 3 | 1500 | 0.2μ | Pt | 1000 | occured |
| 2 | 204 | 110 | 970 | 15 | 2 | 10 | 5 | 40 | 50 n | Ag—Pd | 2000 | " |
| 3 | 223 | 122 | 930 | 23 | 6 | 10 | 10 | 600 | 0.1μ | Au | 1100 | " |
| 4 | 226 | 113 | 1150 | 20 | 10 | 10 | 15 | 2200 | 0.8μ | Au—Pd | 1300 | " |
| 5 | 211 | 110 | 1050 | 10 | 7 | 13 | 7 | 30 | 0.1μ | Pd | 1600 | " |
| 6 | 230 | 109 | 1000 | 13 | 3 | 12 | 8 | 3000 | 0.2μ | Au | 2800 | none |
| 7 | 201 | 118 | 980 | 30 | 3 | 4 | 8 | 2100 | 0.5μ | Ag—Pd | 3000 | " |
| 8 | 225 | 103 | 950 | 25 | 3 | 15 | 8 | 2700 | 0.6μ | Au—Pt | 2500 | " |
| 9 | 205 | 103 | 950 | 23 | 3 | 9 | 8 | 2800 | 0.6μ | Au | 2600 | " |
| 10 | 215 | 121 | 930 | 14 | 2 | 9 | 8 | 1300 | 0.3μ | Ag | 2300 | " |
| 11 | 202 | 114 | 930 | 20 | 5 | 3 | 20 | 3100 | 0.2μ | Ag—Pd | 2400 | " |
| 12 | 202 | 116 | 910 | 40 | 4 | 6 | 10 | 2500 | 0.8μ | Ag—Pd | 2000 | " |
| 13 | 216 | 102 | 910 | 35 | 4 | 12 | 10 | 3000 | 0.5μ | Au | 2600 | " |
| 14 | 212 | 111 | 910° C. | 29 | 4 | 12 | 3 | 2100 | 0.6μ | Au | 2200 | " |
| 15 | 203 | 115 | 900 | 17 | 4 | 12 | 3 | 2400 | 0.7μ | Au | 2400 | " |
| 16 | 229 | 116 | 900 | 37 | 4 | 7 | 5 | 2000 | 0.6μ | Ag | 2300 | " |
| 17 | 212 | 110 | 850 | 45 | 5 | 12 | 5 | 80 | 80 n | Ag—Pd | 2500 | " |
| 18 | 220 | 106 | 830 | 11 | 3 | 8 | 9 | 100 | 30 n | Ag—Pd | 2700 | " |
| 19 | 222 | 105 | 790 | 7 | 5 | 4 | 6 | 900 | 0.1μ | Ag | 1900 | occured |
| 20 | 228 | 109 | 500 | 15 | 1 | 19 | 6 | 600 | 80 n | Au—Pt | 2200 | " |
| 21 | 217 | 101 | 810 | 40 | 6 | 17 | 4 | 1500 | 0.2μ | Ag—Pd | 2000 | none |
| 22 | 207 | 121 | 920 | 53 | 5 | 20 | 8 | 1400 | 0.2μ | Ag—Pd | 2100 | " |
| 23 | 206 | 102 | 900 | 22 | 3 | 20 | 10 | 2500 | 20 n | Ag | 3300 | " |
| 24 | 227 | 103 | 900 | 29 | 5 | 30 | 7 | 2700 | 0.5μ | Ag | 3400 | " |
| 25 | 208 | 107 | 900 | 15 | 7 | 20 | 8 | 2000 | 0.7μ | Ag—Pd | 3000 | " |
| 26 | 214 | 112 | 950 | 31 | 9 | 10 | 22 | 2300 | 0.1μ | Au | 3100 | " |
| 27 | 221 | 115 | 880 | 13 | 4 | 36 | 10 | 3000 | 50 n | Ag | 3100 | " |
| 28 | 224 | 117 | 880° C. | 5 | 2 | 6 | 4 | 1800 | 0.15μ | Ag | 2900 | " |
| 29 | 228 | 115 | 850° C. | 19 | 1 | 13 | 5 | 2500 | 20 n | Ag—Pd | 2800 | " |
| 30 | 226 | 101 | 890° C. | 36 | 3 | 39 | 9 | 2000 | 0.1μ | Au | 3000 | " |
| 31 | 223 | 122 | 1000 | 22 | 3 | 22 | 8 | 1000 | 40 n | Au—Pt | 2500 | " |
| 32 | 209 | 112 | 970 | 29 | 4 | 18 | 2 | 1800 | 0.4μ | Ag—Pd | 2200 | " |
| 33 | 210 | 108 | 970 | 47 | 4 | 10 | 10 | 3000 | 0.2μ | Ag—Pd | 2300 | " |
| 34 | 220 | 106 | 970 | 19 | 5 | 10 | 9 | 50 | 5 n | Ag—Pd | 2400 | occured |
| 35 | 219 | 105 | 950 | 27 | 6 | 21 | 9 | 3000 | 0.6μ | Au | 1500 | " |
| 36 | 202 | 121 | 960 | 13 | 2 | 25 | 5 | 1000 | 0.1μ | Au | 2200 | none |
| 37 | 217 | 122 | 960 | 17 | 2 | 4 | 5 | 1100 | 0.15μ | Ag | 2100 | " |
| 38 | 214 | 104 | 960 | 17 | 2 | 11 | 10 | 3200 | 0.4μ | Ag—Pd | 2500 | " |
| 39 | 209 | 114 | 960 | 23 | 4 | 9 | 9 | 2800 | 0.9μ | Ag—Pd | 2800 | " |
| 40 | 204 | 115 | 900 | 59 | 5 | 30 | 12 | 2900 | 1.2μ | Ag | 2400 | " |
| 41 | 210 | 111 | 900 | 70 | 3 | 7 | 6 | 1300 | 0.3μ | Ag | 2600 | " |
| 42 | 223 | 107 | 900° C. | 45 | 4 | 11 | 7 | 2000 | 0.6μ | Ni | 2500 | " |
| 43 | 230 | 102 | 900 | 41 | 2 | 13 | 7 | 2400 | 0.3μ | Ni | 2600 | " |
| 44 | 215 | 112 | 940 | 43 | 4 | 12 | 10 | 2000 | 0.4μ | Ni | 2600 | " |
| 45 | 205 | 120 | 940 | 20 | 4 | 40 | 8 | 3100 | 1.1μ | Ni | 2400 | " |
| 46 | 216 | 103 | 940 | 17 | 5 | 16 | 8 | 3000 | 0.8μ | Cr | 2500 | " |
| 47 | 224 | 103 | 940 | 31 | 3 | 12 | 13 | 3100 | 0.7μ | Cr | 2700 | " |
| 48 | 208 | 109 | 940 | 31 | 5 | 20 | 10 | 2600 | 0.5μ | Cr | 1700 | occured |
| 49 | 212 | 108 | 940 | 40 | 5 | 10 | 6 | 2800 | 1.5μ | Cr | 2400 | none |
| 50 | 218 | 119 | 950 | 27 | 2 | 9 | 8 | 1300 | 0.3μ | Cr | 2300 | " |
| 51 | 211 | 121 | 950 | 51 | 9 | 9 | 20 | 1100 | 0.2μ | Ag | 2600 | " |
| 52 | 226 | 108 | 950 | 36 | 3 | 10 | 6 | 2700 | 0.4μ | Ag—Pd | 2600 | " |
| 53 | 204 | 120 | 950 | 23 | 2 | 15 | 8 | 2900 | 0.4μ | Au | 2800 | " |
| 54 | 219 | 113 | 950 | 29 | 4 | 9 | 8 | 2300 | 0.3μ | Ag—Pd | 1300 | occured |

As described above, the multilayer ceramic hybrid substrate containing capacitors, resistors, and conductor wiring according to this invention can be sintered simultaneously at a low temperature in the range of 800° C. to 1000° C. in an oxidizing atmosphere, to form the plurality of capacitors. In addition, a miniature, high-density component containing a large-capacity capacitor, or a high-density, large mounting area, hybrid substrate with a satisfactorily high mechanical strength can be obtained. An improvement in the working efficiency and reliability can be realized by simplifying the process and reducing the cost. A high-conductivity conductor can also be utilized.

Furthermore, the multilayer hybrid substrate of this invention can be utilized in various electronic circuits for TV tuners, FM tuners, automobiles and other applications.

Those who are skilled in the art will readily perceive how to modify the invention. Therefore, the appended claims are to be construed to cover all equivalent structures which fall within the true scope and spirit of the invention.

We claim:

1. A multilayer ceramic substrate with at least one interlayered capacitor and at least one resistor comprising: a first ceramic body having a pair of principal surfaces and including a plurality of laminated first ceramic sheets with a high dielectric constant and a plurality of internal electrodes sandwiching the respective first ceramic sheets to form capacitors therebetween, a second ceramic body laminated over one of said principal surfaces of said first ceramic body and having a plurality of laminated second ceramic sheets of a ceramic material which is different from the ceramic material of said first ceramic sheets and having a low dielectric constant, at least one resistor layer sandwiched between said second ceramic sheets, a plurality of first wiring layers sandwiched between said second ceramic sheets, a third ceramic body laminated over the other of said principal surfaces of said first ceramic body and having a plurality of laiminated third ceramic sheets formed of a ceramic material which is the same as the ceramic material which forms said second ceramic sheets, said second ceramic body and said third ceramic body being thicker than said first ceramic body, a plurality of external electrodes provided on an external surface of said second ceramic body and wiring conductors within said first and second ceramic body for interconnecting said internal electrodes, said resistor layer, said first wiring layers, and said external electrodes.

2. The ceramic substrate as claimed in claim 1, further comprising a plurality of second wiring layers sandwiched between said third ceramic sheets.

3. The ceramic substrate as claimed in claim 2, further comprising a plurality of external electrodes provided on an external surface of said third ceramic body.

4. The ceramic substrate as claimed in claim 3, further comprising at least one resistor layer located inside said third ceramic body and being electrically connected to said external electrodes on the external surface of said third ceramic body.

5. A hybrid ceramic structure comprising a plurality of glass-ceramic insulator layers sandwiching at least one dielectric layer with interposed circuit patterns, wherein each glass-ceramic insulator layer has a composition consisting essentially of oxides in the ranges of: 40 through 60 percent by weight of aluminum oxide, 1 through 40 percent by weight of lead oxide, 1 through 30 percent by weight of boron oxide, 2 through 40 percent be weight of silicon dioxide, zero through 2.5 percent by weight of at least one oxide selected from oxides of chemical elements in Group I of the periodic table, 0.01 through 25 percent by weight of at least one oxide selected from oxides of chemical elements in Group II of the periodic table, and 0.01 through 10 percent by weight of at least one oxide selected from oxides of chemical elements in Group IV of the periodic table except for carbon, silicon, and lead.

6. A hybrid ceramic structure as claimed in claim 5, wherein said chemical elements of the Group I are sodium, and potassium, said chemical elements of the Group II being magnesium, calcium, strontium, barium, and zinc, and said chemical elements of the Group IV being zirconium, titanium, germanium, and tin.

7. A hybrid ceramic structure as claimed in claim 5, wherein said dielectric layer consists essentially of composition selected from the following group of compositions (i) though (vii):

(i) $[Pb(Fe_{\frac{1}{2}}Nb_{\frac{1}{2}})O_3]_x \cdot [Pb(Fe_{\frac{2}{3}}W_{\frac{1}{3}})O_3]_y \cdot [(Pb(Zn_{\frac{1}{3}}Nb_{\frac{2}{3}})O_3]_z$ wherein $x+y+z=1.00$ and the proportions x, y and z fall within the respective ranges of: $0.02 \leq X \leq 0.79$, $0.20 \leq Y \leq 0.50$, and $0.0 \leq Z \leq 0.48$;

(ii) $[Pb(Mg_{\frac{1}{2}}W_{\frac{1}{2}})O_3]_x \cdot [PbTiO_3]_y \cdot [Pb(Ni_{\frac{1}{3}}Nb_{\frac{2}{3}})O_3]_z$ wherein $x+y+z=1.00$ and the proportions x, y, and z fall within the respective ranges of: $0.19 \leq x \leq 0.70$, $0.20 \leq y \leq 0.50$, and $0.01 \leq z \leq 0.40$;

(iii) $[Pb(Mg_{\frac{1}{2}}W_{\frac{1}{2}})O_3]_x \cdot [PbTiO_3]_y \cdot [Pb(Mg_{\frac{1}{3}}Nb_{\frac{2}{3}})O_3]_z$ wherein $x+y+z=1.00$ and the proportions x, y, and z fall within the respective ranges of: $0.20 \leq x \leq 0.99$, $0.01 \leq y \leq 0.50$, and $0.01 \leq z \leq 0.50$;

(iv) $[Pb(Mg_{\frac{1}{2}}W_{\frac{1}{2}})O_3]_x \cdot [PbTiO_3]_y \cdot [Pb(Mn_{\frac{1}{3}}Me_{\frac{2}{3}})O_3]_z$ wherein Me represents one of Nb, Ta and Sb, $x+y+y=1.00$ and the proportions x, y, and z fall within the respective ranges of: $0.46 \leq x \leq 0.99$, $0.00 \leq y \leq 0.50$, and $0.005 \leq z \leq 0.15$;

(v) $[Pb(Mg_{\frac{1}{2}}W_{\frac{1}{2}})O_3]_x \cdot [PbTiO_3]_y \cdot [PbZrO_3]_z$ wherein $x+y+y=1.00$ and the proportions x, y, and z fall within the respective ranges of: $0.45 \leq x \leq 0.75$, $0.06 \leq y \leq 0.41$, and $0.01 \leq z \leq 0.35$;

(vi) $[Pb(Zn_{\frac{1}{3}}Nb_{\frac{2}{3}})O_3]_x \cdot [Pb(Fe_{\frac{2}{3}}W_{\frac{1}{3}})O_3]_y$ where $x+y=1.00$ and the proportions x and y fall within the respective ranges of: $0.20 \leq x \leq 0.60$, and $0.40 \leq y \leq 0.80$; and (vii) $[Pb(Fe_{\frac{2}{3}}W_{\frac{1}{3}})O_3]_x \cdot [PbTiO_3]_y \cdot [Pb(Mn_{\frac{1}{3}}Me_{\frac{2}{3}})O_3]_z$ wherein Me represents one of Nb, Ta and Sb, $x+y+z=1.00$ and the proportions x, y, and z fall within the ranges of: $0.55 \leq x \leq 0.85$, $0.05 \leq y \leq 0.45$, and $0.00 \leq z \leq 0.10$.

* * * * *